United States Patent [19]
Jaeger et al.

[11] Patent Number: 4,749,920
[45] Date of Patent: Jun. 7, 1988

[54] MULTIPLE POLYPHASE MOTOR DRIVE SYSTEM FOR TEXTILE MACHINE

[75] Inventors: Wolfgang Jaeger; Dieter Werner, both of Göppingen; Claus-Peter Müller, Waldstetten, all of Fed. Rep. of Germany

[73] Assignee: Zinser Textilmaschinen GmbH, Ebersbach, Fed. Rep. of Germany

[21] Appl. No.: 9,385

[22] Filed: Jan. 30, 1987

[30] Foreign Application Priority Data

Feb. 4, 1986 [DE] Fed. Rep. of Germany ....... 3603283
Feb. 27, 1986 [DE] Fed. Rep. of Germany ....... 3606407

[51] Int. Cl.$^4$ ............................................. G01R 29/16
[52] U.S. Cl. .................................. 318/112; 318/490; 318/650; 361/23
[58] Field of Search ............... 318/112, 314, 315, 317, 318/344, 437, 490, 565, 608, 650, 656; 361/23

[56] References Cited

U.S. PATENT DOCUMENTS

| | | | |
|---|---|---|---|
| 3,585,470 | 6/1971 | Connors | 318/112 X |
| 4,288,727 | 9/1981 | Whitford | 318/112 |
| 4,298,831 | 11/1981 | Espelage et al. | 318/112 |

FOREIGN PATENT DOCUMENTS

| | | | |
|---|---|---|---|
| 0995188 | 2/1983 | U.S.S.R. | 361/23 |
| 1117762 | 10/1984 | U.S.S.R. | 361/23 |
| 1213513 | 2/1986 | U.S.S.R. | 361/23 |
| 1224894 | 4/1986 | U.S.S.R. | 361/23 |

Primary Examiner—Bentsu Ro
Attorney, Agent, or Firm—Karl F. Ross; Herbert Dubno

[57] ABSTRACT

A plurality of spindles of a textile machine are all mechanically interconnected and individually grouped, the individual groups of the spindles are driven by respective polyphase electric motors having respective feed lines all connected in parallel to the output lines of a polyphase electric power supply. Either the current or the voltage of the supply is maintained generally constant independent of load and a characteristic of the electricity in the feed lines of only one of the motors is monitored in the constant-current system or in the output lines of the supply in the constant-voltage system. An alarm, for example an optical or acoustic signal or just an indication on a display or printout, is generated when the characteristic of the electricity in any one of the monitored lines varies substantially from that of the other monitored lines.

12 Claims, 2 Drawing Sheets

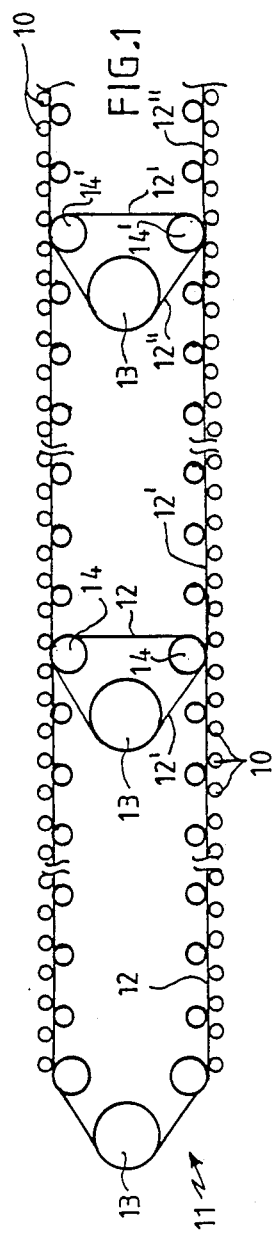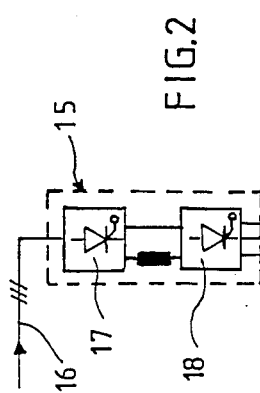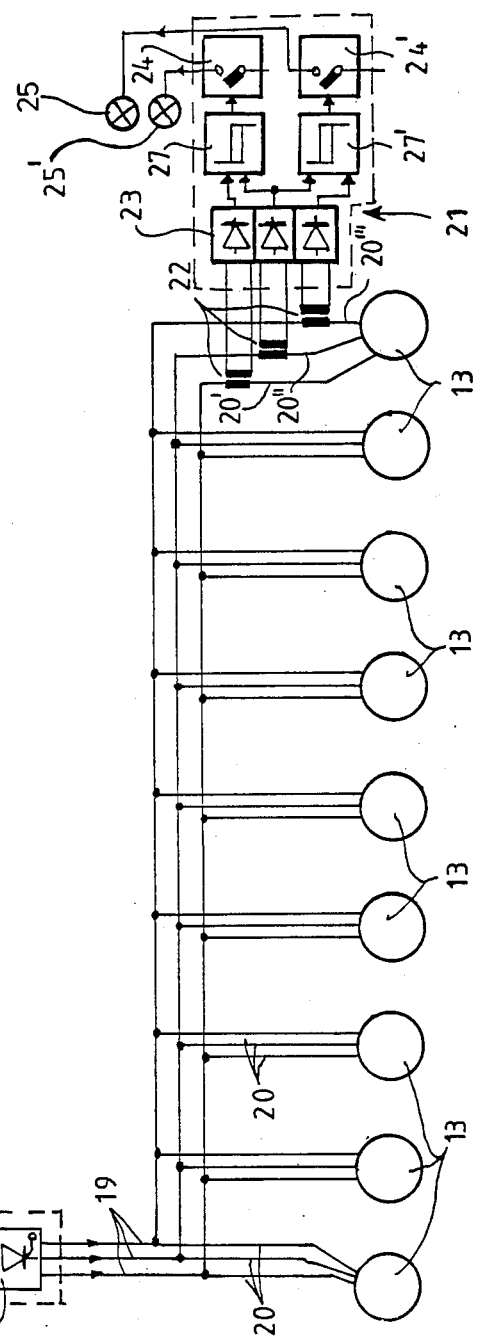

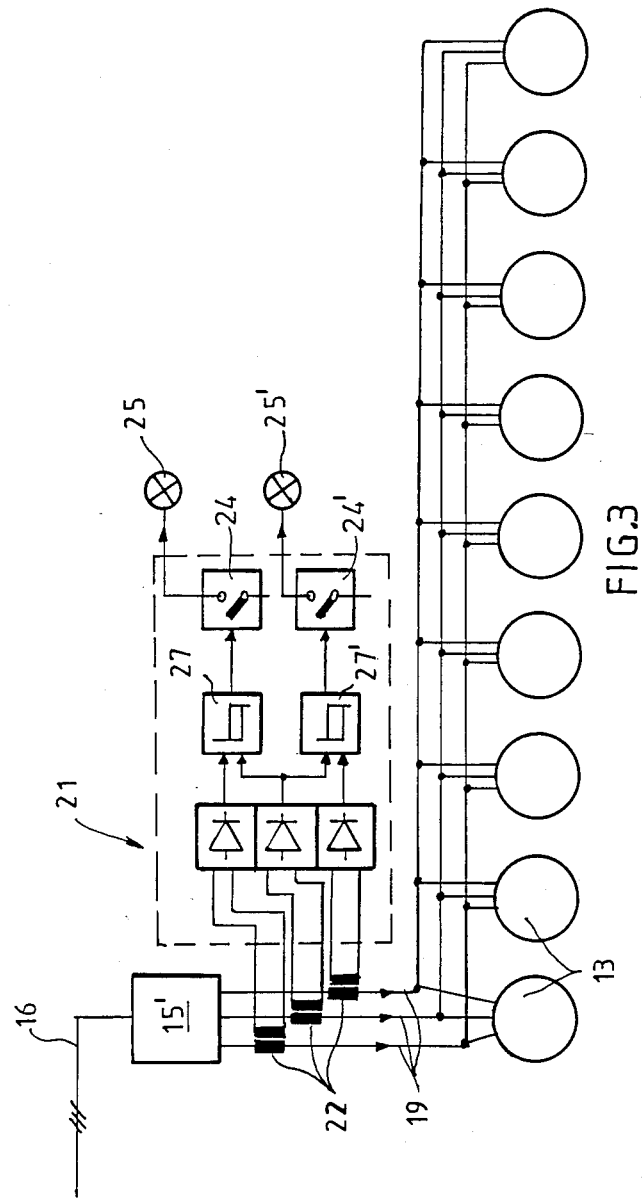

MULTIPLE POLYPHASE MOTOR DRIVE SYSTEM FOR TEXTILE MACHINE

FIELD OF THE INVENTION

The present invention relates to a textile machine. More particularly this invention concerns such a machine having a plurality of parallel-connected polyphase drive motors.

BACKGROUND OF THE INVENTION

It is standard practice to drive many types of textile machines—ring spinners, drafting frames, twisters, and the like—by means of polyphase electric motors. In a standard spinning machine, for example, a battery of parallel spindles have whorls that are tangentially engaged by flat belts. All of the motors are connected in parallel to a common polyphase-current supply so that the motors rotate synchronously. Each belt engages a subgroup of the whorls and is also spanned over a respective drive pulley. In addition each such belt is engaged over at least one pulley or whorl of at least one adjacent group so that there is, along with the electrical interconnection, a mechanical connection that further ensures synchronous rotation of the driven elements.

With such a system if one of the phases of one of the motors fails, the mechanical interconnection ensures that the elements being driven will all continue to rotate synchronously. This type of operation is only safe for short periods of time as it puts a considerable tensile strain on the belts that are assuming the load. It is therefore essential to know as soon as possible of such failure so that remedial action can be taken or, if necessary, the entire machine can be shut down and the motor failure corrected. If the machine is allowed to run too long with one of the motors down, the respective belt is likely to break.

OBJECTS OF THE INVENTION

It is therefore an object of the present invention to provide an improved method of and system for detecting phase failure in a multiple-motor polyphase drive system for a textile machine.

Another object is the provision of such a method of and system for detecting phase failure in a multiple-motor polyphase drive system for a textile machine which in a simple and sure manner detects when any phase of any of a plurality of such parallel-connected polyphase motors drops out.

SUMMARY OF THE INVENTION

This is achieved in a system wherein a plurality of spindles of a textile machine are all mechanically interconnected and individual groups of the spindles are driven by respective polyphase electric motors having respective feed lines all connected in parallel to the output lines of a polyphase electric power supply. According to the invention either the current or the voltage of the supply is maintained generally constant independent of load and a characteristic of the electricity in the feed lines of only one of the motors is monitored in the constant-current system or in the output lines of the supply in the constant-voltage system. An alarm, for example an optical or acoustic signal or just an indication on a display or printout, is generated when the characteristic of the electricity in any one of the monitored lines varies substantially from that of the other monitored lines.

The use of a constant-voltage or constant-current supply means that the dropping-out of a single phase of a single motor, which could for example be one of twenty such identical motors, is easily detected. For example when the current is constant and independent of load, when one phase of one motor drops out the current of all of the corresponding phases of all of the other motors will increase to compensate. Thus if the current is monitored in the other phases of the other motors this increase will be measurable, and if by chance the current is being monitored in the phase that drops out, this also will of course be in evidence. Correspondingly if a constant-voltage supply is used the dropping out of any phase will cause the current in the other phases to drop and thereby signal such failure.

According to this invention the characteristic monitored is voltage, although this is admittedly only best in systems with a small number of motors. Normally current is monitored so that it is very easy to monitor a very large group of parallel connected motors.

In accordance with another feature of this invention the characteristic is compared with the same characteristic of the other feed lines of the one motor. When the variation exceeds a predetermined limit, the alarm or equivalent action is taken. According to another feature of this invention the sensitivity of the comparator or its response threshhold is increased as the current of the supply increases.

DESCRIPTION OF THE DRAWING

The above and other features and advantages will become more readily apparent from the following, reference being made to the accompanying drawing in which:

FIG. 1 is a small-scale and mainly diagrammatic top view of a textile machine according to this invention; and FIGS. 2 and 3 are schematic diagrams illustrating the monitoring system of this invention.

SPECIFIC DESCRIPTION

As seen in FIG. 1 a multiplicity of normally vertical spindles 10 of a spinning machine 11 are arranged in two parallel rows and are engaged tangentially by three flat belts 12, 12', and 12", the belt 12' being somewhat below the belts 12 and 12". Each of these belts 12, 12', and 12" is driven by a respective polyphase electric motor 13 and the belts 12 and 12' are both spanned over common pulleys 14 while the belts 12' and 12" are spanned over common pulleys 14' so that there is a mechanical interconnection between all of the spindles 10 via the belts 12, 12', and 12".

The motors 13 are all identical and have feed wires 20 all connected in parallel. As seen in FIG. 2 the wires 20 are connected to output lines 19 of a power supply 15 that receives power from a three-phase input line 16 and that feeds to the output lines 20 electricity whose current is constant and independent of load and whose frequency is varied to control the speed of the motors 13. Thus this supply 15 comprises a rectifier 17 and a variable-frequency inductive inverter 18 so that the output frequency is independent of the input frequency and the amperage is constant in each of the lines 19 regardless of load.

According to the invention as also shown in FIG. 2 the feed wires 20', 20", and 20'" of one of the motors 13, it being irrelevant which one since all the motors 13 are identical, are connected to a monitoring apparatus 21 having for the wires 20', 20", and 20'" respective coil-type current sensors 22 connected to respective rectifiers/smoothers 23 that produce a nonalternating output current that is directly proportional to the current in the respective wire 20', 20", and 20'". The outputs of the rectifiers 23 for the wires 20' and 20" are both fed to a window-type comparator or discriminator 27 and the outputs of the rectifiers 23 for the wires 20" and 20'" are fed to another such comparator 27'. The outputs of the comparators 27 and 27' are proportional to the difference between the incoming signals. These devices 27 and 27' are in turn connected to respective switches 24 and 24' themselves connected to alarms 25 and 25', here indicator lamps, that are activated whenever the respective devices 27 or 27' detect too great a difference between the incoming signals. The alarms 25 and 25' could be any conceivable system, even a device that ensures an orderly shutdown of the equipment in question.

So long as all of the phases of all of the motors 13 are operating, there will be no appreciable variation between the current in the lines 20', 20", and 20'". If, however, one phase of any of the motors 13 drops out, there will be a change in the current in the corresponding line 20', 20", or 20'" of the motor 13 being monitored by the circuit 21. Thus if, for instance, a motor phase on the same line 19 as the line 20' drops out, there will be a corresponding increase in the current in this line 20' relative to the line 20" it is compared to in the unit 27', and the corresponding alarm 25 will be activated. Similarly any asymmetry reflected in the middle phase line 20" will activate both alarms 25 and 25', and any change in the other end phase line 20'" will be reflected by the other alarm 25'. Thus a single monitoring circuit 21 connected to a single motor 13 will respond if any of the other motors 13 loses a phase, and there can be a very large number of such other motors 13.

If, of course, a phase of the motor 13 being monitored drops out, plainly the current therein will drop to zero and the corresponding alarm 25 or 25' will be activated.

In the system of FIG. 3 a constant-voltage source 15' is used rather than the constant-current source 15, and the sensor coils 22 are placed on its output lines 19 rather than on the feed lines 20. Since the voltage delivered by the supply 15' is constant, if any of the phases of any of the motors 13 drops out the current in the corresponding line 19 will therefore decrease, and the monitoring circuit 21 will respond identically to that of the system of FIG. 2.

We claim:

1. In a method of driving a plurality of spindles of a textile machine wherein the spindles are all mechanically interconnected and individually grouped, the individual groups of the spindles are driven by respective polyphase electric motors having respective feed lines all connected in parallel to the output lines of a polyphase electric power supply, the improvement comprising the steps of:
   maintaining the current of the power supply generally constant independent of load;
   monitoring a predetermined electrical characteristic of a predetermined type of the electricity in the feed lines of only a predetermined single one of the motors; and
   generating an alarm when the predetermined electrical characteristic of the electricity in any one of the feed lines of the predetermined single one of the motors varies substantially from that of the other feed lines of the predetermined single one motor.

2. The improved method defined in claim 1 wherein the predetermined electrical characteristic is current.

3. The improved method defined in claim 1 wherein the predetermined electrical characteristic of one feed line is compared with the electrical characteristic of the same type of the other feed lines of the predetermined single one motor.

4. The improved method defined in claim 1 wherein the alarm is acoustic or optical.

5. The improved method defined in claim 1 wherein the predetermined electrical characteristic of one feed line is compared with the electrical characteristic of the same predetermined type of the other feed lines by a comparator having a response threshold, the method further comprising the step of
   increasing the response threshold proportionately as the output current of the power supply increases.

6. In a system for driving a plurality of spindles of a textile machine wherein the spindles are all mechanically interconnected and individually grouped, the individual groups of the spindles are driven by respective polyphase electric motors having respective feed lines all connected in parallel to the output lines of a polyphase electric power supply, the improvement comprising:
   means for maintaining the current of the power supply generally constant independent of load;
   means for monitoring a predetermined electrical characteristic of a predetermined type of the electricity in the feed lines of only a predetermined single one of the motors; and
   means for generating an alarm when the predetermined electrical characteristic of the electricity in any one of the feed lines of the predetermined single one of the motors varies substantially from that of the other feed lines of the predetermined single one motor.

7. In a method of driving a plurality of spindles of a textile machine wherein the spindles are all mechanically interconnected and individually grouped, the individual groups of the spindles are driven by respective polyphase electric motors having respective feed lines all connected in parallel to the output lines of a polyphase electric power supply, the improvement comprising the steps of:
   maintaining the voltage of the power supply generally constant independent of load;
   monitoring a predetermined electrical characteristic of a predetermined type of the electricity in the output lines of the power supply; and
   generating an alarm when the predetermined electrical characteristic of the electricity in any one of the output lines of the power supply varies substantially from that of the other output lines of the power supply.

8. The improved method defined in claim 7 wherein the predetermined electrical characteristic of one output line is current.

9. The improved method defined in claim 7 wherein the predetermined electrical characteristic of one output line is compared with the electrical characteristic of the same predetermined type of the other output lines of the power supply.

10. The improved method defined in claim 7 wherein the alarm is acoustic or optical.

11. The improved method defined in claim 7 wherein the predetermined electrical characteristic of one output line is compared with the electrical characteristic of the same predetermined type of the other output lines by a comparator having a response threshold, the method further comprising the step of
   increasing the response threshold proportionately as the output current of the power supply increases.

12. In a system for driving a plurality of spindles of a textile machine wherein the spindles are all mechanically interconnected and individually grouped, the individual groups of the spindles are driven by respective polyphase electric motors having respective feed lines all connected in parallel to the output lines of a polyphase electric power supply, the improvement comprising:
   means for maintaining the voltage of the power supply generally constant independent of load;
   means for monitoring a predetermined electrical characteristic of a predetermined type of the electricity in the output lines of the power supply; and
   means for generating an alarm when the predetermined electrical characteristic of the electricity in any one of the output lines of the power supply varies substantially from that of the other output lines of the power supply.

* * * * *